United States Patent [19]

Hoffman et al.

[11] 4,095,126

[45] June 13, 1978

[54] BI-POLAR AMPLIFIER WITH SHARPLY DEFINED AMPLITUDE LIMITS

[75] Inventors: Charles Reeves Hoffman, Raleigh; William Burrell Nunnery, Cary, both of N.C.

[73] Assignee: International Business Machines Corporation, Armonk, N.Y.

[21] Appl. No.: 777,990

[22] Filed: Mar. 16, 1977

[51] Int. Cl.² .............................................. H03K 5/08
[52] U.S. Cl. .................................... 307/237; 307/230; 307/264; 328/169; 328/175; 330/85; 330/110
[58] Field of Search ...................... 307/230, 237, 264; 328/168, 169, 171, 173, 175; 330/85, 110

[56] References Cited

U.S. PATENT DOCUMENTS

| | | | |
|---|---|---|---|
| 3,437,837 | 4/1969 | Hull | 307/237 |
| 3,999,084 | 12/1976 | Beaudette | 307/264 X |

*Primary Examiner*—John Zazworsky
*Attorney, Agent, or Firm*—E. H. Duffield

[57] ABSTRACT

The invention covers an amplifier circuit in which the output is limited in either polarity. Normally, a part of the output voltage is fed back to the input to maintain linearity but when the output reaches a maximum or minimum value, any further departure is amplified and fed back to the input circuit to neutralize the part of input signals which is outside of the range to be amplified. The feedback amplifier can be designed to initiate limiting at any desired output voltages and the positive and negative output limit voltages can be asymmetric with respect to the quiescent output voltage.

3 Claims, 4 Drawing Figures

BI-POLAR AMPLIFIER WITH SHARPLY DEFINED AMPLITUDE LIMITS

This invention relates to an amplifier with an amplitude limiting circuit and, more particularly, to such an amplifier which can be provided as an integrated circuit having a strictly limited output signal.

Amplifiers which have an output that may vary without restriction over a limited amplitude range but have 100 percent or more negative feedback for the part of any amplitude which is outside of the range have been available in tube type circuits for a long time and recent circuits have been developed using field effect transistors (FET) to do a similar function. Such circuits have not been satisfactory for special applications which require D.C. level amplification and a very abrupt transition from an amplifier function to a steady level output at either the upper or lower level limit. One such special application is the control of output voltage in a D.C. to D.C. voltage converter using a ferro-resonant transformer as shown in the article by applicant, W. B. Nunnery, in the IBM Technical Disclosure Bulletin, Volume 15, No. 6, Nov. 1972, at pages 1927–1929. In this converter, a chopper between a D.C. power supply and the primary of a ferro-resonant transformer is controlled in frequency by a voltage controlled oscillator responsive to the rectified D.C. output from the transformer. The control voltage for the oscillator cannot be allowed to be less than a minimum or greater than a maximum limit irrespective of the transformer output, or the driving frequency will be such that the transformer is in an unstable region.

Other desirable characteristics of such a control circuit are that it operate on a low voltage, that the circuits be designable for any reasonable control voltage range, that the transition between a linear amplification range and a fixed limit be abrupt, and that the limits are essentially fixed so that the limit does not vary for any input voltage outside of the control range.

It is then an object of this development to provide an integrated circuit type of amplifier which has its output signal sharply limited to a voltage range by a feedback of any excess output signal to the amplifier input.

It is another object to provide such an integrated circuit in which the feedback circuit includes an amplifier to limit more sharply the output signal to the preselected voltage limits and to do so without loading the input circuit.

It is also an object of the invention to provide an amplifier circuit which does not use reactive circuit elements to enable use of the circuit for D.C. and low frequency circuits as well as the audio range A.C. frequencies.

A still further object is to provide such a circuit which can be designed to provide any desired voltage range between the upper and lower limit voltages, i.e., a range which may be less than one diode drop voltage and may be selected without reference to diode voltage levels.

Other objects will be apparent from the following description of a preferred embodiment of the invention taken in conjunction with the accompanying drawings.

DESCRIPTION

Figure 1:
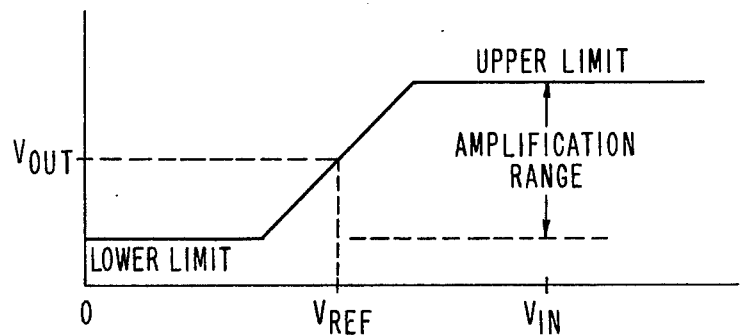
FIG. 1 is a chart showing the optimum relationship between the input voltage and the output voltage desired in the invention.

As pointed out above, the $V_{out}/V_{in}$ relationship should, as shown in FIG. 1, have a linear range about a reference voltage, $V_{REF}$, and at each end of the range should have an abrupt change to an unvarying output. In practice, the transition at the change points is not as sharp as indicated and there is always some change in the output voltage as the input voltage moves farther away from the transition point. These disadvantages are due to the requirements for some feedback signal from the output to compensate for input variations and can be minimized by making the feedback signal as effective as possible.

Figure 2:
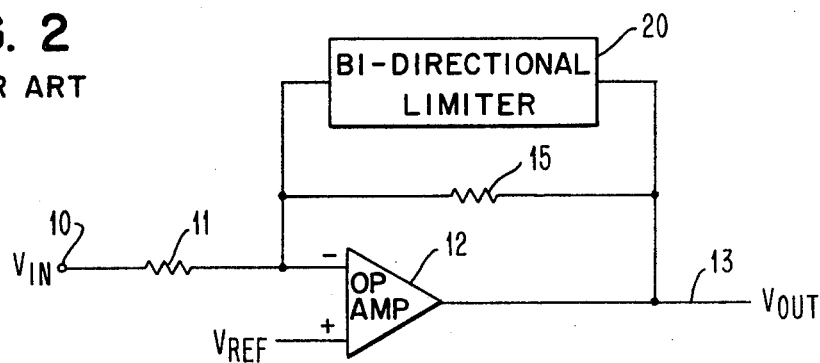
FIG. 2 is a showing of the type of circuits previously proposed for the desired function.

FIG. 2 shows one arrangement which has been used in the prior art to generate the voltage relation of FIG. 1. As shown, an input signal on a terminal 10 is passed through a resistor 11 to the complementing input of an operational amplifier 12 whose output is generated on output line 13. A feedback resistor 15 is connected between the output line 15 and the complementing input of the amplifier 12. A reference voltage approximately midway between the end points of the operating range of the input signal is connected to the other input of operational amplifier 12. With these connections, there is a substantially linear relation between the input and output voltages and the amplification factor of the amplifier is mainly dependent on the ratio of resistors 11 and 15.

To provide the function of limiting the output voltage, a bi-directional limiter circuit 20 is placed across resistor 15. This circuit senses the output voltage on line 13 and when the voltage is at a preset positive or negative voltage, will become active to pass any further changes in output voltage back to the input of the amplifier 12. The original circuits 20 used zener diodes or the like to feedback the signal but this imposes a loading effect on the output of the amplifier, cannot hold the output at a fixed limit, and does not provide a satisfactory transition when it becomes effective. More recently, the circuit 20 has incorporated active components which do not load the output line 13 and provide a more effective feedback to hold down the output voltage changes with respect to input voltage variations outside the limits.

Figure 3:
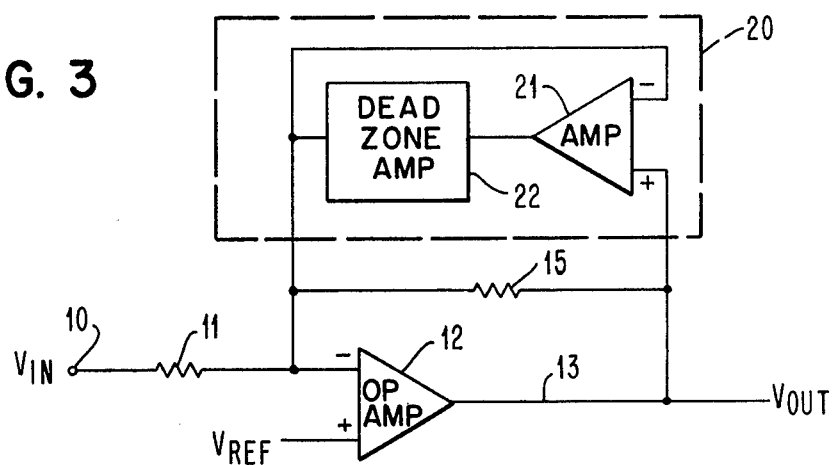
FIG. 3 is a diagrammatic showing of applicants' embodiment of a limited output amplifier.

These bi-directional limiters of the prior art are not satisfactory as the control circuits for the ferro-resonant power supplies described for they do not provide for a flat enough limited output voltage and, because of threshold voltage limitations, they can initiate limiting only at multiplies of a diode voltage drop. The embodiment shown in FIG. 3 will avoid these limitations of the prior art. In this figure, the bi-directional limiter 20 comprises an amplifier 21 having an input connected to the output line 13 of amplifier 12 and a dead zone amplifier 22 having its input connected to the output of amplifier 21 and its output connected to both the input of amplifier 12 and to a second inverting input of amplifier 21. In this structure, the dead zone amplifier 22 will be effective to limit the input voltage of amplifier 12 as soon as the input voltage from amplifier 21 is high enough to exceed the dead zone range. This can be a substantial voltage equal to at least several diode voltage drops. However, this dead zone range voltage reduced by the amplification of amplifier 21 will be the effective voltage range at the output of amplifier 12 so that by proper design of amplifier 21 and selection of its amplifying factor, the output voltages on line 13 needed to initiate the limiting action can be set at any desired value. These can be less than one diode drop if such low limits are needed and can be asymmetric with respect to the reference voltage if the circuit application calls for such limits.

Figure 4:
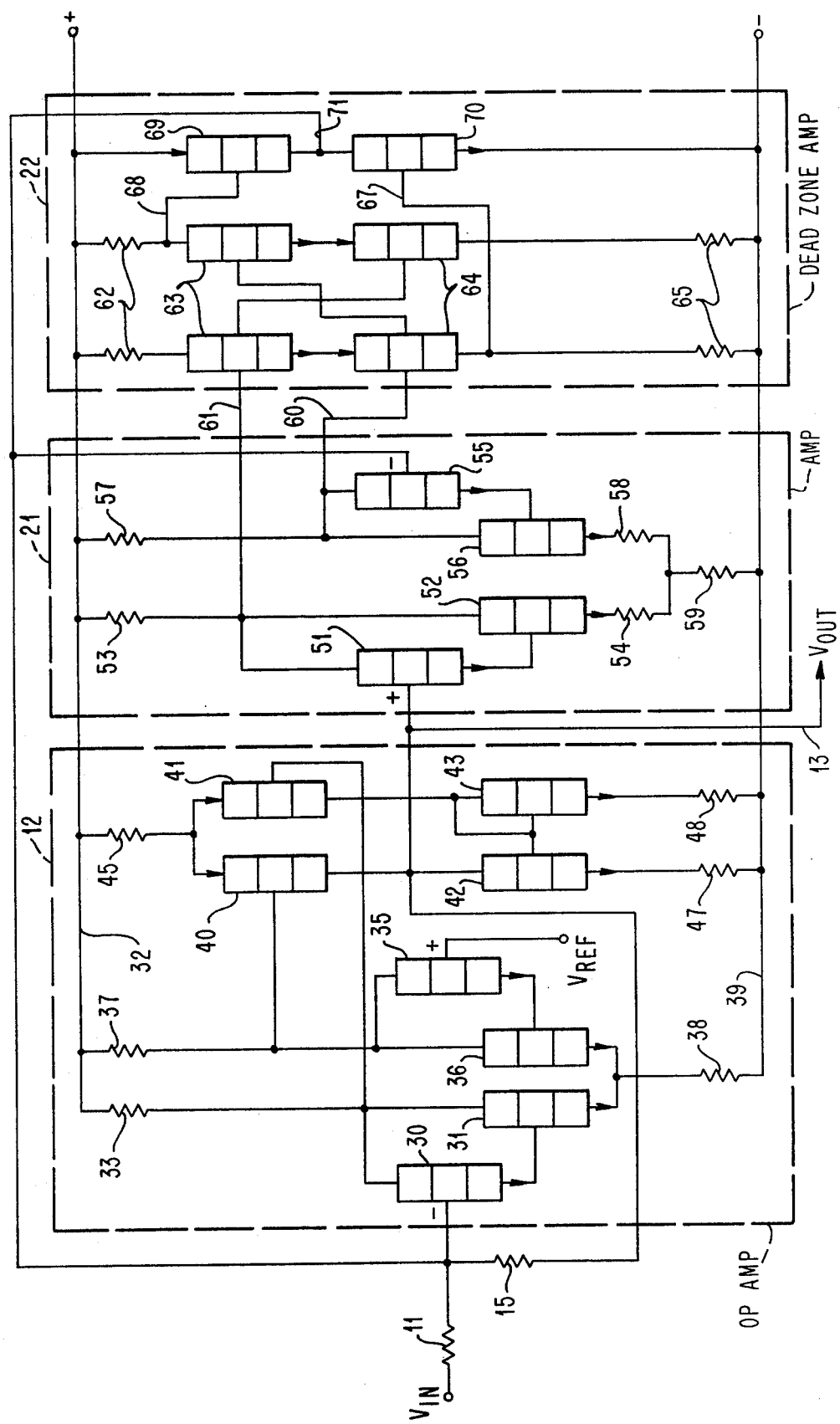
FIG. 4 is a detailed circuit diagram of the FIG. 3 structure.

FIG. 4 shows the schematic diagram for the preferred embodiment of the invention. The operational amplifier 12 shown in dotted lines at the left side comprises a pair of transistors 30 and 31 in a Darlington connection with their collectors connected to the positive lead 32 of a power supply through resistor 33 and the base of transistor 30 receiving the input signal through resistor 11. A second pair of transistors 35 and 36, also in a Darlington connection, have their collectors connected to lead 32 through a resistor 37 and the base of transistor 35 is connected to a fixed reference voltage. The emitters of transistors 31 and 36 are connected together and through a common resistor 38 to the negative lead 39 of the power supply.

The output of transistors 30, 31, 35 and 36 is amplified by a set of four transistors 40, 41, 42, and 43. Transistors 40 and 41 have their emitters connected together and through a resistor 45 to positive line 32. The collector of transistor 40 is connected through a transistor 42 and a resistor 47 in series to the negative lead 39. Also, the collector of transistor 41 is connected through a transistor 43 and a resistor 48 in series to the lead 39. The bases of transistors 42 and 43 are connected together and to the collector of transistor 43 to enable these transistors to act as a current mirror. The bases of transistors 40 and 41 are connected to the collectors of transistors 36 and 31, respectively, to receive a push-pull pair of control signals corresponding to the input signal $V_{in}$. The amplified output at the collector of transistor 40 is the amplifier output $V_{out}$ on line 13 and also is fed back through resistor 15 to the base of transistor 30.

Amplifier 21 has a pair of transistors 51 and 52 in a Darlington connection with their collectors connected through a resistor 53 to positive lead 32 and the emitter of transistor 52 is connected to one end of a resistor 54. The base of transistor 51 is connected to the $V_{out}$ line 13 to receive the output signal. A second pair of transistors 55 and 56, also in a Darlington connection, have their collectors connected to positive lead 32 through a resistor 57 and the emitter of transistor 56 is connected to one end of a resistor 58. The other ends of resistors 54 and 58 are connected together and through a resistor 59 to the negative lead 39. The base of transistor 55 is connected to the input of amplifier 12. The gain of amplifier 21 is determined by the ratios of resistors 53:54 and 57:58 and is used to match the circuit design requirements to the dead zone characteristics. The output signal of amplifier 21 appears across two lines 60 and 61 connected, respectively, to the collectors of transistors 56 and 52.

The dead zone amplifier 22 has two identical circuits connected between leads 32 and 39. Each circuit comprises a resistor 62, a transistor 63, a transistor 64 of an opposite conductivity type, and a resistor 65 in series. The base of each transistor 63 is connected to the base of the transistor 64 in the other circuit of the pair and to one or the other of the collectors of transistors 51 and 55. In the connection shown, there will be no conduction in either circuit until the voltage difference between lines 60 and 61 becomes at least equal to the sum of the $V_{BE}$ drops for the two transistors 63 and 64 in series. If the voltage difference is such that line 61 is more positive than line 60, then the left pair 63, 64 will be conducting to raise the voltage of the collector of transistor 64 on line 67 and this will initiate conduction in a transistor 70 to draw current over lead 71 from the input to amplifier 12 and thereby prevent any further voltage increase at that input. If the voltage $V_{in}$ at the input of amplifier 12 decreases to a point such that the voltage difference between wires 60 and 61 is sufficiently positive, then conduction is started in the right-hand pair of transistors to reduce the voltage on a wire 68 connected to the collector of the right-hand transistor 63. Lead 68 is connected to the base of a transistor 69 having its emitter connected to lead 32 and its collector connected to lead 71. Conduction in the right pair of transistors 63, 64 will enable conduction in transistor 69 to feed current to lead 71 which will feed back to input resistor 11 to prevent any further lowering of the input voltage to amplifier 12. Thus, the start of conduction in a pair of transistors 63, 64 will feed back a current to the input circuit to prevent any further change in the output voltage.

It will be seen that output voltage limiting will be initiated when the voltage difference between lines 60 and 61 is equal to $2V_{BE}$ in either a positive or negative sense. The required voltage can be increased by inserting diodes between the emitters of a pair of transistors 63 and 64 or the difference between the positive limit output voltage and the output voltage under quiescent conditions may be made different from the difference between the negative limited output voltage and the output voltage under quiescent conditions by inserting different numbers of diodes in the connections between the emitters of the transistors 63, 64.

The above description of a preferred embodiment of the invention is illustrative only and many variations are possible within the scope of the invention as set out in the following claims.

What is claimed is:

1. An amplitude limiting circuit for the output of a primary amplifier comprising an operational amplifier having a pair of input connections and an operational amplifier output terminal, a reference voltage source connected to one of said operational amplifier inputs, a resistor connecting said other of said operational amplifier input connections to a source of a signal to be amplified, and a resistor connecting said operational amplifier output terminal with said other operational amplifier input connection, said limiting circuit comprising:
   a primary amplifier having at least two inputs and two outputs with an input connected to said operational amplifier output terminal to generate on said two primary amplifier outputs an amplified representation of the signal at said operational amplifier output terminal; and
   a dead zone amplifier having two inputs connected to the output of said primary amplifier and an output connected to the other said input of said primary amplifier and to said other input of said operational amplifier, said dead zone amplifier acting to generate a voltage signal of opposite polarity to said signal to be amplified when the amplitude of the output signal of said operational amplifier is outside of a predetermined zone.

2. An amplitude limiting circuit as set out in claim 1 characterized in that said primary amplifier includes:

two similar amplifying circuits having loaded outputs with a part of their respective loads in common;

an input from the output of said operational amplifier to the input of one of said amplifying circuits; and a feedback connection to the input of the other of said amplifying circuits from said dead zone amplifier;

whereby said amplifying circuits generate output signals of equal magnitude and opposite polarity for application to said dead zone amplifier.

3. An amplitude limiting circuit as set out in claim 1 wherein said dead zone amplifier comprises:

a pair of circuits connected in parallel between the leads of a power supply, each circuit including a first resistor, a first transistor of a first type and a second transistor of a complementary type, said first and second transistors having their emitters connected together, and a second resistor;

base circuit connections from the base of the transistor of the first type in each one of said pair of circuits to the base of the complementary transistor in the other of said pair of circuits;

input leads from said base circuit connections to said amplifier;

a third circuit connected between said power supply leads and comprising a pair of transistors of complementary types having their collectors connected together and to an output of said dead zone amplifier;

a conductor from the collector of one of said first type transistors of said pair of circuits to the base of said transistor of the complementary type in said third circuit; and a conductor from the collector of complementary type in the other of said pair of circuits to the base of said transistor of said first type in said third circuit.

* * * * *